United States Patent
Knaack et al.

[11] Patent Number: 5,812,465
[45] Date of Patent: Sep. 22, 1998

[54] REDUNDANCY CIRCUIT AND METHOD FOR PROVIDING WORD LINES DRIVEN BY A SHIFT REGISTER

[75] Inventors: Roland T. Knaack, Starkville, Miss.; Cameron B. Lacy, Kanata, Canada; Brendon L. Johnson, Santa Clara, Calif.

[73] Assignee: Cypress Semiconductor Corp., San Jose, Calif.

[21] Appl. No.: 691,357

[22] Filed: Aug. 2, 1996

[51] Int. Cl.[6] ................................ G11C 7/00
[52] U.S. Cl. .................. 365/200; 365/225.7; 327/525
[58] Field of Search ................ 365/225.7, 200, 365/96, 221; 327/525, 526

[56] References Cited

U.S. PATENT DOCUMENTS

| | | | |
|---|---|---|---|
| 4,802,122 | 1/1989 | Auvinen et al. | 365/154 |
| 4,839,866 | 6/1989 | Ward et al. | 365/221 |
| 4,875,196 | 10/1989 | Spaderna et al. | 365/238 |
| 4,891,788 | 1/1990 | Kreifels | 365/49 |
| 5,084,837 | 1/1992 | Matsumoto et al. | 395/250 |
| 5,088,061 | 2/1992 | Golnabi et al. | 365/189.01 |
| 5,228,002 | 7/1993 | Huang | 365/221 |
| 5,262,996 | 11/1993 | Shiue | 362/221 |
| 5,305,253 | 4/1994 | Ward | 365/73 |
| 5,311,475 | 5/1994 | Huang | 365/221 |
| 5,317,756 | 5/1994 | Komatsu et al. | 395/800 |
| 5,341,267 | 8/1994 | Whitten et al. | 327/525 |
| 5,367,486 | 11/1994 | Mori et al. | 365/189.05 |
| 5,404,332 | 4/1995 | Sato et al. | 365/201 |
| 5,406,273 | 4/1995 | Nishida et al. | 340/825.51 |
| 5,406,554 | 4/1995 | Parry | 370/58.1 |
| 5,426,612 | 6/1995 | Ichige et al. | 365/220 |
| 5,467,319 | 11/1995 | Nusinov et al. | 365/231 |
| 5,490,257 | 2/1996 | Hoberman et al. | 395/427 |
| 5,506,809 | 4/1996 | Csoppenszky et al. | 365/221 |
| 5,513,318 | 4/1996 | van de Goor et al. | 395/185.01 |
| 5,521,876 | 5/1996 | Hattori et al. | 365/221 |
| 5,530,674 | 6/1996 | McClure et al. | 365/200 |
| 5,546,347 | 8/1996 | Ko et al. | 365/221 |
| 5,663,679 | 9/1997 | Manning | 327/526 |

FOREIGN PATENT DOCUMENTS

| | | | |
|---|---|---|---|
| 0113996 | 8/1989 | Japan | G11C 17/00 |
| 2-189799 | 7/1990 | Japan | 365/225.7 |
| 0676559 | 6/1994 | Japan | G11C 7/00 |

*Primary Examiner*—Son Mai
*Attorney, Agent, or Firm*—Maiorana & Acosta, P.C.

[57] ABSTRACT

The present invention disables defective rows in a FIFO or other buffer where the word lines of the FIFO buffer are driven by a shift register scheme. Additional enabled rows may be placed within the normal memory array. The additional enabled rows are substituted, as needed, for one or more defective rows. As a result, a defective row can be disabled without effecting the operation of the FIFO, particularly the read or write data path. In one example, the disabling effect is achieved by using one or more laser fuses. The present invention can be used to effectively bypass any single shift register element or a multiple number of shift register elements.

15 Claims, 4 Drawing Sheets

5,812,465

1

REDUNDANCY CIRCUIT AND METHOD FOR PROVIDING WORD LINES DRIVEN BY A SHIFT REGISTER

FIELD OF THE INVENTION

The present invention relates to buffers generally and more particularly, to a circuit and method for disabling defective word lines in a FIFO or other buffer having word lines driven by a shift register.

BACKGROUND OF THE INVENTION

Memory arrays can use redundant memory cells to compensate for production errors. Specifically, after the production of a complete memory array, a post production test of the memory is generally performed. If the post-production testing indicates that a particular cell of the memory array is defective, a redundant memory cell can be substituted. This substitution typically occurs after the entire memory array has been manufactured. By allowing an invalid memory cell to be replaced by a redundant cell after production, the memory array can still be used.

A first-in first-out (FIFO) buffer receives data at an input and presents data to an output. The data presented to the output is presented in an order that is consistent with the order that the data was received at the input. As a result, a typical FIFO buffer does not require external address signals for operation. This lack of external address signals makes it difficult to provide redundant memory cells.

SUMMARY OF THE INVENTION

The present invention disables defective rows in a FIFO or other buffer where the word lines or rows of the FIFO buffer are driven by a shift register scheme. Additional enabled rows may be placed within the normal memory array. The additional enabled rows are substituted, as needed, for one or more defective rows. As a result, a defective row can be disabled without effecting the operation of the FIFO, particularly the read or write data path. In one example, the disabling effect is achieved by using one or more laser fuses. The present invention can be used to effectively bypass any single shift register element or a multiple number of shift register elements.

The objects, features and advantages of the present invention include providing a circuit and method that enables a redundancy in memory designs where word lines are driven by shift registers. The present invention can be used with groups of shift register elements of any size greater than one or can be applied to individual shift register elements of the die. Each shift register group or element that is connected to a word line with defective memory cells can be disabled by triggering as few as a single laser fuse or other type of fuse. The means for disabling the particular shift register group that is connected to a word line with defective memory cells may be accomplished without having a fused path directly between the input supply voltage and ground. The present invention provides a repairable die while introducing no ill effects on any other data sheet or operating parameters.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
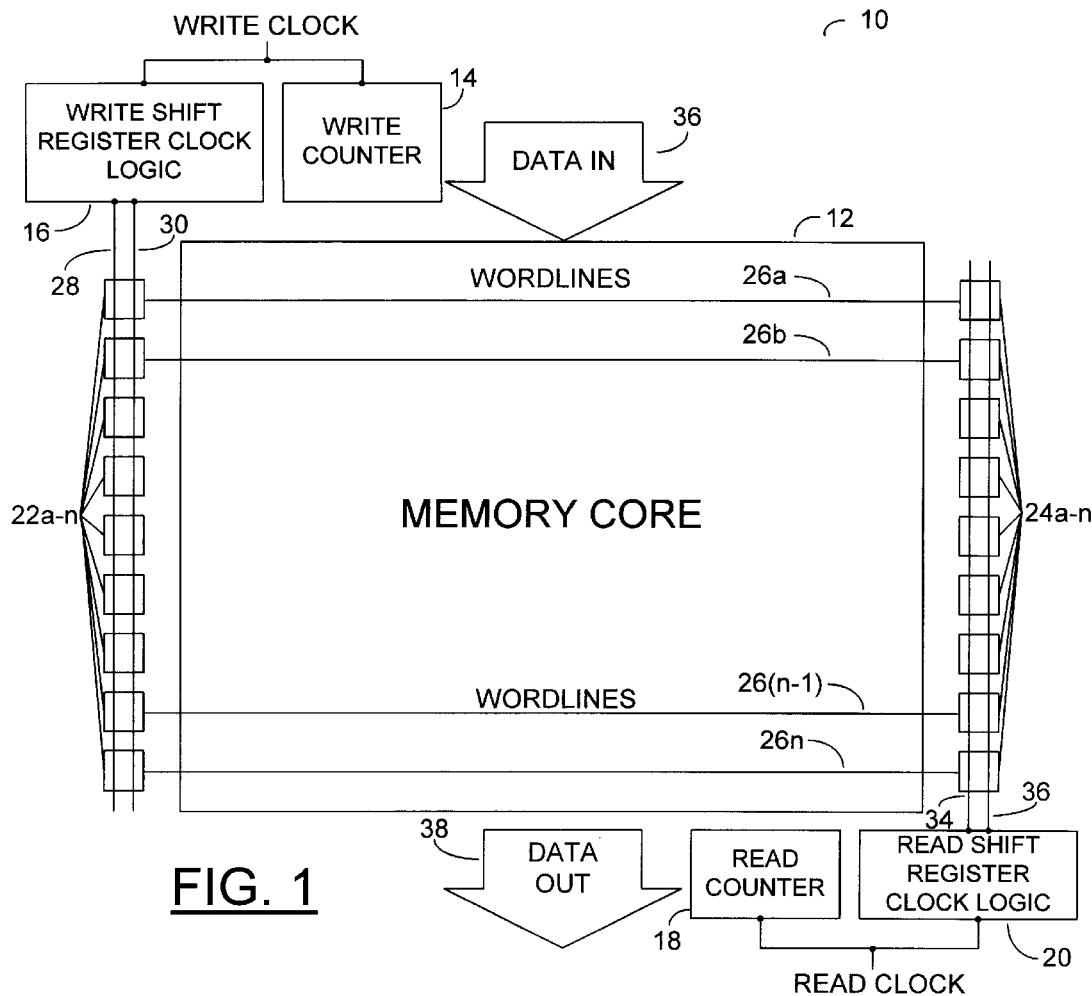
FIG. 1 is a block diagram illustrating the overall architecture of a memory array.

Referring to FIG. 1, a block diagram of a circuit 10 is shown in accordance with a preferred embodiment of the present invention. The circuit 10 generally comprises a memory core 12, a write counter 14, a write shift register clock logic 16, a read counter 18 and a read shift register clock logic 20. The circuit 10 also comprises a number of write shift register elements 22a–22n, a number of read shift register elements 24a–24n, a number of word lines 26a, 26b. . . 26(n-1) and 26(n). The write shift register clock logic 16 generally receives a write clock signal and generally presents a signal on a bus 28 and a signal on a bus 30 that are generally received by each of the write shift register elements 22a–22n. Similarly, the read shift register clock logic 20 may receive a read clock signal and may present an output on a bus 32 and an output on a bus 34 that are generally received by each of the read shift register elements 24a–24n. Each of the shift register elements 22a–22n and 24a–24n controls a particular row (i.e., word line 26a–26n) of the memory array 12. The number of rows present is one factor in determining the size of the memory array 12. Another factor in determining the size of the memory array 12 is the width of the particular words received at the data in 36 and presented at the data out 38. To implement a redundant memory system, additional word lines 26a–26n may be provided. For example, in a memory array 12 where four redundant rows are to be provided, the word lines 26n, 26(n-1), 26(n-2) and 26(n-3) may be implemented as redundant rows. Specifically, the redundant rows would be in addition to the number of rows necessary to implement the full size of the memory array 12. In an example where a 4K×18×bit memory array is desired, 4K rows would be provided plus an additional four rows for redundancy purposes. During the post production testing of the memory array 12, if a particular row 26a–26(n-4) is determined to be defective, one of the redundant rows (i.e., 26n, 26(n-1), 26(n-2) and 26(n-3)) may be substituted. This is preferably accomplished by bypassing the shift register 22a–22(n-4) and the shift register 24a–24(n-4) that correspond to the particular defective row 26a–26(n-4). The next available row, for example 26(n-3), will become active in producing the desired size of the memory array 12.

Figure 2:
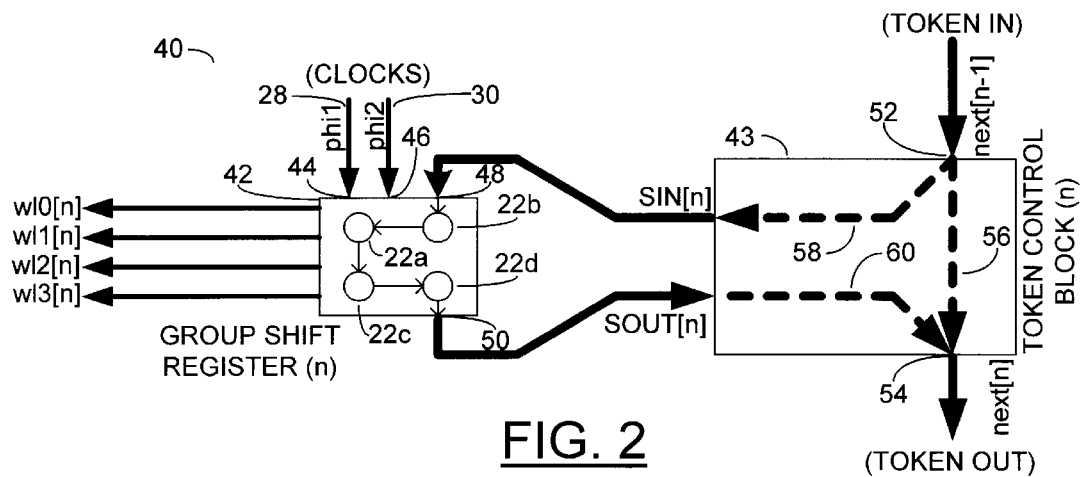
FIG. 2 is a block diagram showing a specific shift register group and the implementation for bypassing the shift register group connected to a wordline that contains a defective cell.

Referring to FIG. 2, a circuit 40 of the preferred embodiment of the present invention is shown. The circuit 40 comprises a shift register group 42 and a token control block 43. The shift register group 42 comprises a number of individual shift registers 22a–22d that correspond to FIG. 1. The shift register group 42 is shown for illustrative purposes only. Specifically, a single shift register 22 may be substituted for the shift register group 42 without departing from the spirit of the present invention. By implementing a shift register group 42, for individual word lines WL0[n], WL1 [n], WL2[n] and WL3[n], four individual shift registers 22a–22d may be implemented as single shift register group 42. The shift register group 42 has an input 44 that generally receives a signal from the bus 28 and an input 46 that generally receives a signal from the bus 30. The shift register group 42 also has an input 48 that generally receives a signal SIN[n] from the token control block 43. The shift register group 42 has an output 50 that generally presents a signal SOUT[n] to the token control block 43. The token control block 43 has a first internal path 56 that may receive the data from the input 52 and may present data at the output 54. The first internal path 56 represents a state where the shift register group 42 is generally disabled or bypassed. A second internal path 58 and a third internal path 60 may create a second path through the token control block 43 that may activate the shift register group 42. The second internal path generally receives data from the input 52 and may present data as the signal SIN[n] to the input 48. The output 50 then presents the signal SOUT[n] that is generally returned through the third internal path 60 to the output 54. The first internal path 56 is normally selected when a fusing system (to be shown in detail in FIGS. 3–8) is blown. Therefore, when the fuse is blown, the input 52 is generally connected directly to the output 54. When the fuse is not blown, the input 52 is generally connected to the shift register group 42 through the second internal path 58 and returned from the output 50 through the third internal path 60 to the output 54. The fuse essentially allows for the bypassing of the shift register group 42.

Figure 3:
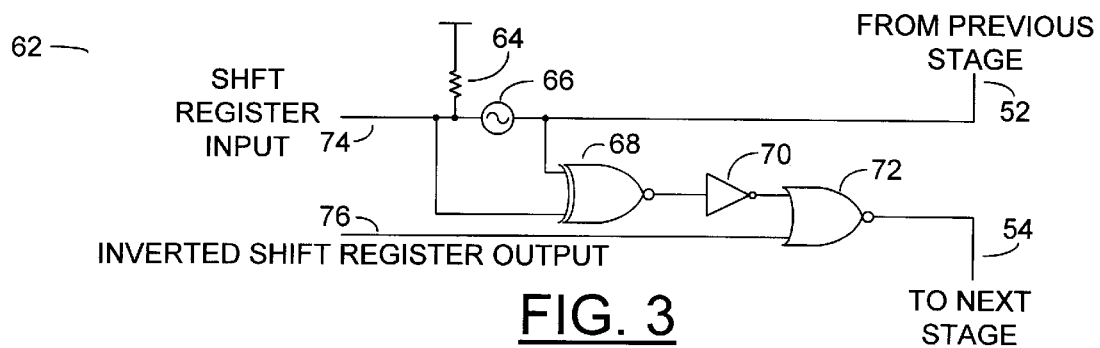
FIG. 3 is a circuit diagram of a preferred embodiment of the present invention illustrating a specific implementation for bypassing a shift register group as shown in FIG. 2.

Referring to FIG. 3, a fuse block 62 for selecting the paths through the token control block 43 is generally shown. The fuse block 62 generally comprises a resistor 64, a fuse element 66, an XNOR gate 68, an inverter 70 and a NOR gate 72. The resistor 64 generally has a first side connected to an input supply voltage (not shown) and a second side generally connected to a first side of the fuse element 66, a first input of the XNOR gate 68 and a shift register input 74. A second side of the fuse element 66 is generally connected to a second input of the XNOR gate 68 as well as to the input 52. The output of the XNOR gate 68 is generally presented to an input of the inverter 70. An output of the inverter 70 is generally presented to a first input of the NOR gate 72. A second input of the NOR gate 72 is generally received from an input 76 representing an inverted shift register output. An output of the NOR gate 72 is generally presented to the output 54.

The following TABLE 1 illustrates the logic of the XNOR gate 68:

TABLE 1

| I₁ | I₂ | O₁ |
|----|----|----|
| 0  | 0  | 1  |
| 0  | 1  | 0  |
| 1  | 0  | 0  |
| 1  | 1  | 1  |

The first column labeled I1 generally represents one input to the XNOR gate 68 while the second column $I_2$ generally represents a second input to the XNOR gate 68. The third column $O_1$ represents the output of the XNOR gate 68.

Figure 4:
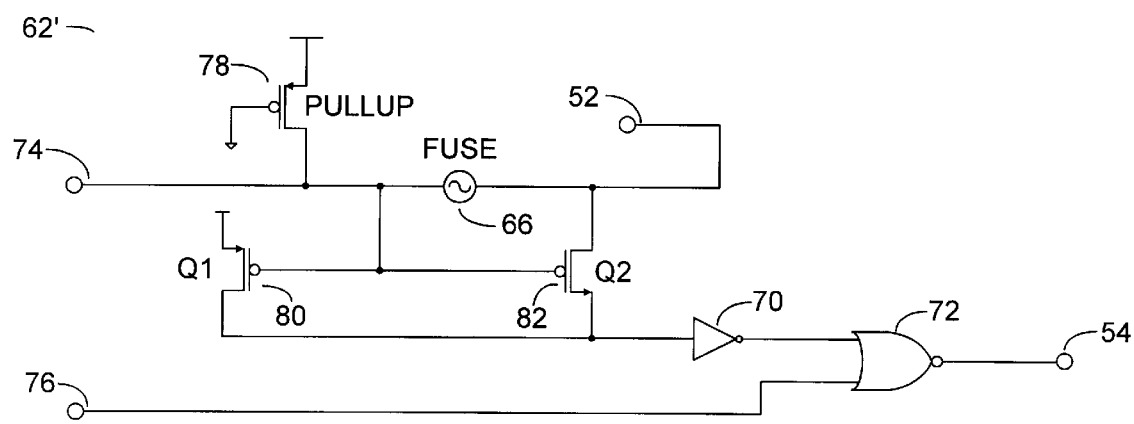
FIG. 4 is an alternate implementation of the circuit diagram shown in FIG. 3.

Referring to FIG. 4, an alternate implementation of the fuse block 62' is shown. The alternate fuse block 62' generally replaces the resistor 64 with a pull-up transistor 78. Additionally, the XNOR gate 68 is generally replaced by a transistor 80 and a transistor 82. When the fuse element 66 is intact, the signal from the input 52 will generally be passed through to the output 74 which is generally connected to the shift register group 42. The signal then will generally be received at the input 76 from the shift register group 42 and passed through to the output 54. When the input 52 is idle (e.g., high), the transistor 82 will generally be "ON" and the inverter 70 will drive low. When the input 52 is active (e.g., in an active low configuration), the transistor 80 is generally "ON" and the inverter 70 will drive low. As a result, with one input to the NOR gate 72 always low, the NOR gate 72 acts as an inverter and will generally present an output 54 if the input 76 is active (e.g., high). When the fuse element 66 is blown, the input 76 will always be a digital "0" since the pull-up transistor 78 keeps the output 74 in a "high" state. As a result, the NOR gate 72 acts as a second inverter and the output 54 follows the input 52 since the transistor 82 remains "ON". As a result, a single fuse element 66 can be implemented to provide the desired switching.

Figure 5:
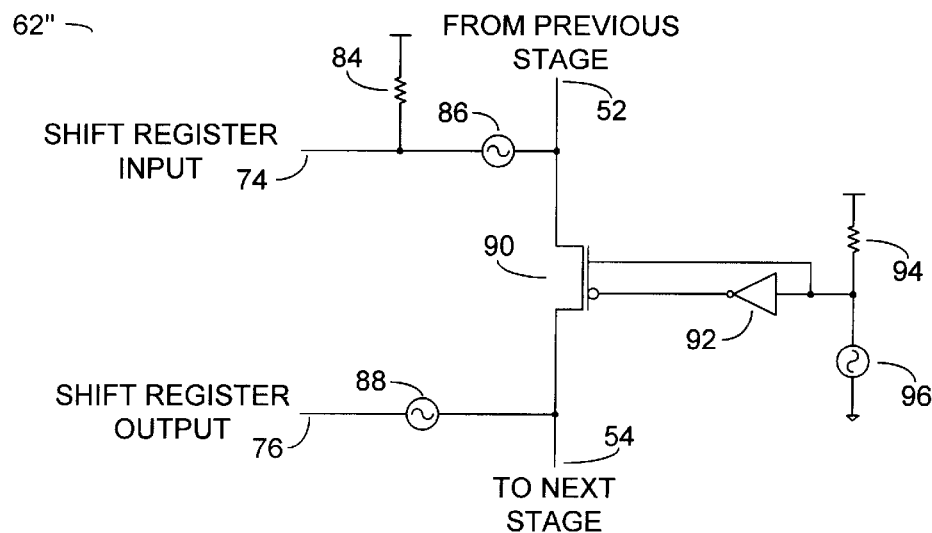
FIG. 5 is an alternate implementation of the circuit diagram shown in FIG. 3.

Referring to FIG. 5, an alternate fuse block 62" is shown. The alternate fuse block 62" comprises a resistor 84, a fuse element 86, a fuse element 88, a CMOS pass gate 90, an inverter 92, a resistor 94 and a fuse element 96. The fuse element 86 is generally connected between the input 52 and the output 74. The resistor 84 is generally connected between an input supply voltage (not shown) and the output 74. The fuse element 88 is generally connected between the input 76 and the output 54. The output 54 is generally coupled to an output of the CMOS pass gate 90. An input of the CMOS pass gate 90 is generally coupled to the input 52. A first side of the resistor 94 is generally coupled to an input supply voltage (not shown). The second side of the resistor 94 is generally coupled to the fuse element 96, an input of the inverter 92 and an NMOS gate input of the CMOS pass gate 90. The fuse element 96 is generally coupled between the resistor 94 and ground. An output of the inverter 92 is generally coupled to a PMOS gate input of the CMOS pass gate 90.

The alternate fuse block 62" requires a minimum number of components. However, it does generally require three separate fuse elements 86, 88 and 96 to provide the proper functioning. In order to disable a particular shift register group 42, the three fuse elements 86, 88 and 96 are blown together. Additionally, the resistor 94 and the fuse element 96 generally create a path from an input supply voltage (not shown) to ground when none of the fuse elements 86, 88 or 96 are blown. Since the fuse block 62" will generally be implemented on a number of rows 26a–26n, a large amount of power will generally be consumed. Additionally, the fuse elements 86, 88 and 96 generally consume a large amount of chip real estate. However, where a minimum number of components is desired, the fuse block 62" is acceptable.

Figure 6:
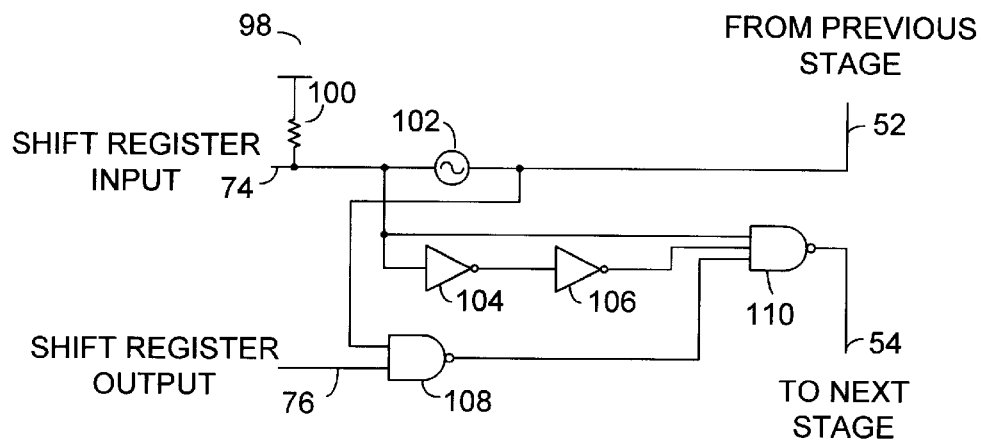
FIG. 6 is an additional alternate implementation of the circuit diagram shown in FIG. 3.

Referring to FIG. 6, a fuse block 98 is shown. The fuse block 98 generally comprises a resistor 100, a fuse element 102, an inverter 104, an inverter 106, a NAND gate 108 and a NAND gate 110. The input 52 is generally connected through the fuse element 102 to the output 74. The resistor 100 is generally connected between an input supply voltage (not shown) and the output 74. The input 52 is also generally coupled to a first input of the NAND gate 108. A second input of the NAND gate 108 is generally coupled to the input 76. The fuse element 102 is also generally coupled to a first input of the NAND gate 110 as well as to an input of the inverter 104. The output of the inverter 104 is generally coupled to the input of the inverter 106 which generally presents an output to a second input of the NAND gate 110. A third input of the NAND gate 110 is generally received from the NAND gate 108. The NAND gate 110 presents a signal to the output 54. The fuse block 98 accomplishes the desired results of bypassing a particular shift register group 42 when a single fuse element 102 is blown. However, the fuse block 98 requires additional circuit components. As compared to the implementation shown in FIGS. 3 and 4.

Figure 7:
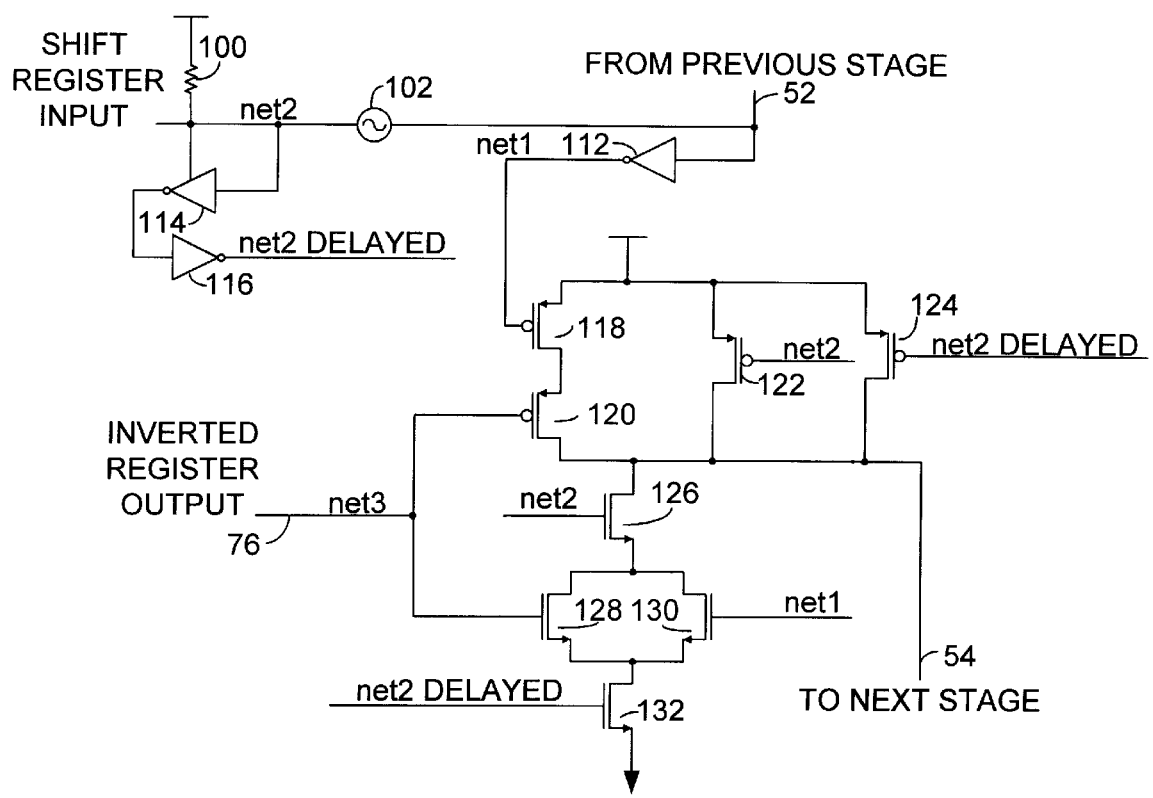
FIG. 7 is an alternate embodiment of the circuit diagram shown in FIG. 3.

Referring to FIG. 7, an alternate fuse block 98' is shown. The alternate fuse block 98' comprises inverters 112–116 and transistors 118–132. The alternate fuse block 98' operates in a similar fashion to the fuse block 98 shown in FIG. 6 in that a single fuse element 102 provides the desired operation.

Figure 8:
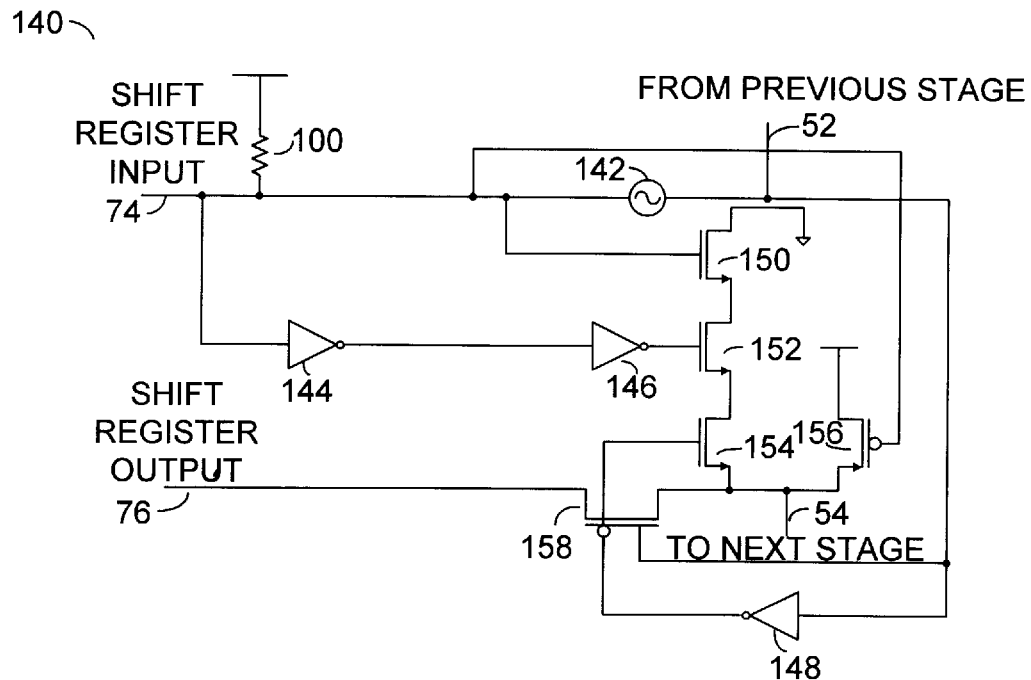
FIG. 8 is an alternate embodiment of the circuit diagram shown in FIG. 3.

Referring to FIG. 8 a fuse block 140 is shown. The fuse block 140 generally comprises inverters 144–148, transistors 150–156 and a CMOS pass gate 158. The fuse block 140 provides a similar function as the fuse block 98 and the fuse block 98'.

Figure 9:
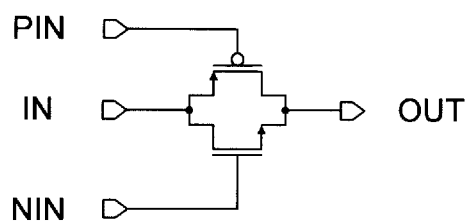
FIG. 9 is a circuit diagram of a CMOS pass gate.

Referring to FIG. 9, a CMOS pass gate is shown in greater detail. The PMOS gate input may be represented by the signal PIN while the NMOS gate input may be represented by the signal NIN. The input may be represented by the signal IN while the output may be represented by the signal OUT.

The following TABLE 2 illustrates the distinctions between the alternate implementations illustrated in FIGS. 3–8:

TABLE 2

| Figure | Implementation | Fuses | Transistors | Pull-ups (resistors) | Fused path from power to ground |
| --- | --- | --- | --- | --- | --- |
| FIG. 3 | (XOR-NOR) | 1 | 8 | 1 | no |
| FIG. 4 | (NOR) | 1 | 6 | 1 | no |
| FIG. 5 | (simple) | 3 | 4 | 3 | yes |
| FIG. 6 | (NAND-NAND) | 1 | 14 | 1 | no |
| FIG. 7 | (complex gate) | 1 | 14 | 1 | no |
| FIG. 8 | (complex gate) | 1 | 13 | 1 | no |

Regardless of the implementation of the fuse block, the functioning of disabling a defective row and replacing it with a redundant row is generally realized. When the redundant row is disabled, the memory core works around that particular row and then utilizes an additional row from the redundant rows to provide the appropriate sized buffer. With this implementation, the external device does not receive any indication that a particular row is disabled. Specifically, the internal redundancy circuitry is transparent to the external device in which it is implemented.

While the invention has been particularly shown and described with reference to preferred embodiments thereof, it will be understood by those skilled in the art that various changes in form and details may be made without departing from the spirit and scope of the invention.

We claim:

1. A circuit comprising:
   means for providing (a) a first path from an input to an output in a repairable FIFO buffer and (b) a second path from the input through an external device to the output of said repairable FIFO buffer; and
   fuse means comprising one or more fuse elements and a plurality of logic gates, said fuse means for selecting between (a) said first path and (b) said second path.

2. The circuit according to claim 1 wherein said fuse means comprises a single fuse element and a plurality of logic gates.

3. The circuit according to claim 2 wherein said logic gates comprise: (a) one or more inverters and (b) one or more NAND gates.

4. The circuit according to claim 2 wherein said plurality of logic gates comprises: (a) one or more XNOR gates, (b) one or more inverters and (c) one or more NOR gates.

5. The circuit according to claim 2 wherein said plurality of logic gates comprises: (a) one or more inverters and (b) one or more transistors.

6. The circuit according to claim 5 wherein said transistors comprises: (a) one or more PMOS transistors, (b) one or more NMOS transistors and (c) one or more CMOS pass gates.

7. The circuit according to claim 2 wherein said plurality of logic gates comprises: (a) one or more inverters, (b) one or more resistors and (c) one or more CMOS pass gates.

8. The circuit according to claim 1 wherein said external device comprises one or more shift registers each connected to one or more word lines in said repairable FIFO buffer.

9. A repairable FIFO buffer providing row redundancy and selective row disabling according to the circuit of claim 1.

10. A method for:
    (a) providing a first path through a first plurality of logic gates from an input to an output;
    (b) providing a second path, through one or more shift registers each connected to one or more word lines in a FIFO buffer, from said input to said output; and
    (c) selecting between said first path and said second path by disabling one or more fuse elements.

11. The method according to claim 10 wherein said first and second paths comprise: (a) one or more inverters and (b) one or more NAND gates.

12. The method according to claim 11, wherein said first and second paths are provided in a FIFO buffer.

13. A circuit comprising:
    a control block circuit configured to provide (a) a first path from an input to an output and (b) a second path from said input, through one or more shift registers each connected to one or more word lines in a FIFO buffer, to said output; and
    a fuse block comprising one or more fuse elements and one or more logic gates, said fuse block configured to select between (a) said first path and (b) said second path.

14. The circuit according to claim 13 wherein said fuse block comprises a single fuse element and one or more logic gates.

15. A repairable FIFO buffer providing row redundancy and selective row disabling according to the circuit of claim 13.

* * * * *